US008922210B2

(12) United States Patent
Marinelli et al.

(10) Patent No.: US 8,922,210 B2
(45) Date of Patent: Dec. 30, 2014

(54) METHOD AND APPARATUS FOR PERFORMING DIFFUSION SPECTRUM IMAGING

(75) Inventors: Luca Marinelli, Niskayuna, NY (US); Kevin King, Menomonee Falls, WI (US); Christopher Hardy, Niskayuna, NY (US); Marion Menzel, Munich (DE)

(73) Assignee: General Electric Company, Niskayuna, NY (US)

( * ) Notice: Subject to any disclaimer, the term of this patent is extended or adjusted under 35 U.S.C. 154(b) by 588 days.

(21) Appl. No.: 13/077,517

(22) Filed: Mar. 31, 2011

(65) Prior Publication Data
US 2012/0249136 A1   Oct. 4, 2012

(51) Int. Cl.
*G01V 3/00* (2006.01)
*G01R 33/563* (2006.01)
*G01R 33/561* (2006.01)

(52) U.S. Cl.
CPC ...... *G01R 33/56341* (2013.01); *G01R 33/5611* (2013.01)
USPC ........................................ 324/309

(58) Field of Classification Search
USPC ........................... 324/300–322; 600/407–445
See application file for complete search history.

(56) References Cited

U.S. PATENT DOCUMENTS

| 6,614,226 | B2 * | 9/2003 | Wedeen | 324/309 |
|---|---|---|---|---|
| 7,034,531 | B1 * | 4/2006 | Tuch et al. | 324/309 |
| 7,495,440 | B2 | 2/2009 | Chiang et al. | |
| 7,688,068 | B2 * | 3/2010 | Beatty | 324/307 |
| 8,014,616 | B2 * | 9/2011 | Chakraborty et al. | 382/233 |
| 8,400,152 | B2 * | 3/2013 | Lin | 324/309 |
| 8,581,589 | B2 * | 11/2013 | Wald et al. | 324/322 |
| 8,653,818 | B2 * | 2/2014 | Adalsteinsson et al. | 324/309 |
| 8,717,024 | B2 * | 5/2014 | King et al. | 324/309 |
| 2010/0152567 | A1 * | 6/2010 | Bryskhe et al. | 600/410 |
| 2010/0253337 | A1 | 10/2010 | Tseng et al. | |
| 2011/0301441 | A1 * | 12/2011 | Bandic et al. | 600/306 |
| 2012/0249136 | A1 * | 10/2012 | Marinelli et al. | 324/309 |
| 2012/0280686 | A1 * | 11/2012 | White et al. | 324/309 |
| 2012/0321759 | A1 * | 12/2012 | Marinkovich et al. | 426/231 |

OTHER PUBLICATIONS

Lee et al., "Compressed Sensing Based Diffusion Spectrum Imaging", Proceedings of International Society for Magnetic Resonance in Medicine, 2010, Stockholm, Sweden.
Merlet et al., "Compressed Sensing for Accelerated EAP Recovery in Diffusion MRI", 13th International Conference on Medical Image Computing and Computer Assisted Intervention, pp. 14, Sep. 20-24, 2010, Beijing, China.

* cited by examiner

*Primary Examiner* — Dixomara Vargas
(74) *Attorney, Agent, or Firm* — Melissa K. Dobson

(57) ABSTRACT

A method of generating a magnetic resonance (MR) image of a tissue includes acquiring MR signals at undersampled q-space encoding locations for a plurality of q-space locations that is less than an entirety of the q-space locations sampled at the Nyquist rate, wherein the acquired signal at the q-space locations represents the three-dimensional displacement distribution of the spins in the imaging voxel, synthesizing the MR signal for the entirety of q-space encodings using a compressed sensing technique for a portion of q-space locations at which MR data was not acquired, combining the acquired MR signals at q-space encodings and the synthesized MR signals at q-space encodings to generate a set of MR signals at q-space encodings that are evenly distributed in q-space, using the set of MR signals at q-space encodings to generate a function that represents a displacement probability distribution function of the set of spins in the imaging voxel, and generating an image of the tissue based on at least a portion of the generated function. A system and computer readable medium are also described herein.

17 Claims, 6 Drawing Sheets

METHOD AND APPARATUS FOR PERFORMING DIFFUSION SPECTRUM IMAGING

BACKGROUND

The subject matter disclosed herein relates generally to magnetic resonance imaging (MRI) systems, and more particularly to a method of performing accelerated Diffusion Spectrum Imaging (DSI) using an MRI system.

DSI is an imaging technique to generate diffusion information that may be utilized in the clinical evaluation of various diseases, for example, traumatic brain injuries and/or multiple sclerosis. In DSI, the information is encoded in both q-space or diffusion space and image space. The q-space information may then be used to characterize the diffusion properties of water molecules. More specifically, by applying a series of diffusion encoding gradient pulses in multiple directions and strengths, a three-dimensional characterization of the water diffusion process may be generated at each spatial location (image voxel). The MR signal in q-space is generally related to the water displacement probability density function at a fixed echo time by the Fourier transform. The diffusion information encoded in q-space may be separated into both angular and radial components. The angular component reflects the underlying tissue anisotropy, whereas the radial component provides information about the eventual geometric restrictions in the diffusion process.

Conventional DSI techniques provide acceptable information for the diffusion properties of water in the brain or other organs. However, the high dimensionality of DSI (3D in spatial domain and 3D in q-space) requires the patient to be scanned for an extended period of time, which substantially limits the effectiveness of the conventional DSI technique when utilized in vivo.

BRIEF DESCRIPTION

In accordance with an embodiment, a method of generating a magnetic resonance (MR) image of a tissue is provided. The method includes acquiring the MR signal at a plurality of q-space locations for a plurality of q-space locations that is less than an entirety of the q-space locations sampled at the Nyquist rate, wherein the acquired signal at the q-space locations represents the three-dimensional displacement distribution of the spins in the imaging voxel, synthesizing the MR signal for the entirety of for q-space encodings using a compressed sensing technique for a portion of q-space locations at which MR data was not acquired, combining the acquired MR signals at q-space encodings and the synthesized MR signals at q-space encodings to generate a set of MR signals at q-space encodings that are evenly distributed in q-space, using the set of MR signals at q-space encodings to generate a function that represents a displacement probability distribution function of the set of spins in the imaging voxel, and generating an image of the tissue based on at least a portion of the generated function. A system and computer readable medium are also described herein.

In another embodiment, a Magnetic Resonance Imaging (MRI) system including a Diffusion Spectrum Imaging (DSI) module is provided. The DSI module is programmed to acquire the MR signal at a plurality of q-space locations distributed non-uniformly that is less than an entirety of the q-space locations sampled at the Nyquist rate, wherein the acquired signal at the q-space locations represents the three-dimensional displacement distribution of the spins in the imaging voxel, synthesizing the MR signal for the entirety of q-space encodings using a compressed sensing technique for a portion of q-space locations at which MR data was not acquired, combining the acquired MR signals at q-space encodings and the synthesized MR signals at q-space encodings to generate a set of MR signals at q-space encodings that are evenly distributed in q-space, using the set of MR signals at q-space encodings to generate a function that represents a displacement probability distribution function of the set of spins in the imaging voxel, and generating an image of the tissue based on at least a portion of the generated function. In a further embodiment, a non-transitory computer readable medium is provided. The computer readable medium is programmed to acquire the MR signal at a plurality of q-space locations distributed non-uniformly that is less than an entirety of the q-space locations sampled at the Nyquist rate, wherein the acquired signal at the q-space locations represents the three-dimensional displacement distribution of the spins in the imaging voxel, synthesizing the MR signal for the entirety of q-space encodings using a compressed sensing technique for a portion of q-space locations at which MR data was not acquired, combining the acquired MR signals at q-space encodings and the synthesized MR signals at q-space encodings to generate a set of MR signals at q-space encodings that are evenly distributed in q-space, using the set of MR signals at q-space encodings to generate a function that represents a displacement probability distribution function of the set of spins in the imaging voxel, and generating an image of the tissue based on at least a portion of the generated function.

DETAILED DESCRIPTION

Figure 1:
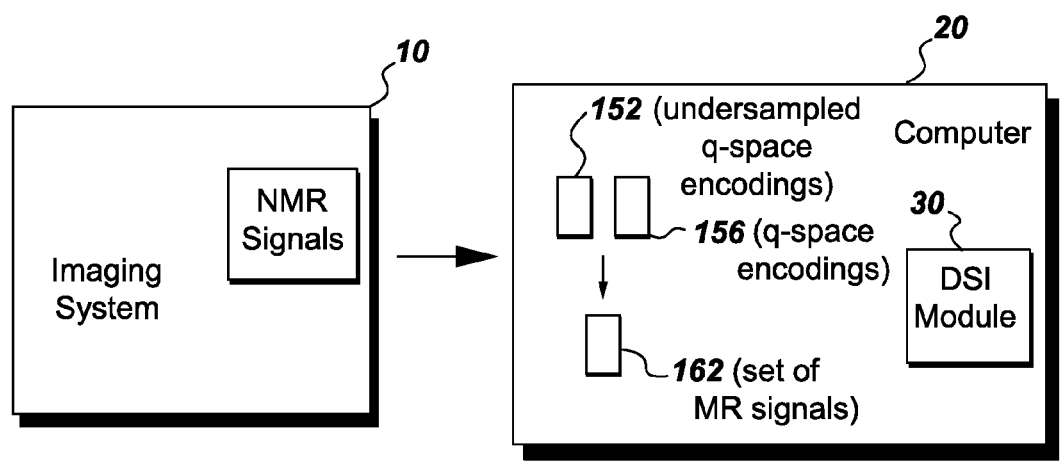
FIG. 1 is a simplified block diagram of magnetic resonance imaging (MRI) system formed in accordance with various embodiments.

Embodiments of the invention will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for reducing the acquisition time for performing diffusion spectrum imaging using Magnetic Resonance Imaging (MRI) systems. Specifically, various embodiments acquire undersampled information and then utilize a compressed sensing technique to fill in gaps in the undersampled information. Additionally, randomly undersampling the diffusion encoding gradient set and reconstructing the data acquired in this manner using a compressed sensing technique enables the scan time to be shortened while maintaining the same approximate resolution in diffusion space as is acquired using a conventional unaccelerated DSI scan. Thus, by practicing various embodiments, and at least one technical effect, acquisition time is reduced. Optionally, various embodiments enable the resolution in diffusion space to be increased while maintaining the same scan time.

FIG. 1 is a simplified block diagram of an exemplary imaging system 10 that is formed in accordance with various embodiments. In the exemplary embodiment, the imaging system 10 is a MRI system. The imaging system 10 also includes a computer 20 that receives the imaging data and processes the imaging data to reconstruct an image of an object (not shown). In operation, the system 10 is configured to polarize a population of spins into an object, such as a tissue, to produce a set of nuclear magnetic resonance (NMR) signals 12 that include diffusion encoding through a set of randomly distributed q-space encoding gradients representative of a three-dimensional displacement probability distribution function of the spins in the tissue. In various embodiments, the computer 20 may include a Diffusion Spectrum Imaging (DSI) module 30 that is programmed to acquire the MR signal at undersampled q-space encodings 152, synthesize the MR signal at q-space encodings 156 using a compressed sensing technique, form a set 162 of q-space encodings using the encodings 152 and 156, and generate an image of an object using the set 162 of MR signals at q-space encodings as described in more detail herein. It should be noted that the DSI module 30 may be implemented in hardware, software, or a combination thereof. For example, the DSI module 30 may be implemented as, or performed, using tangible non-transitory computer readable medium.

Figure 2:
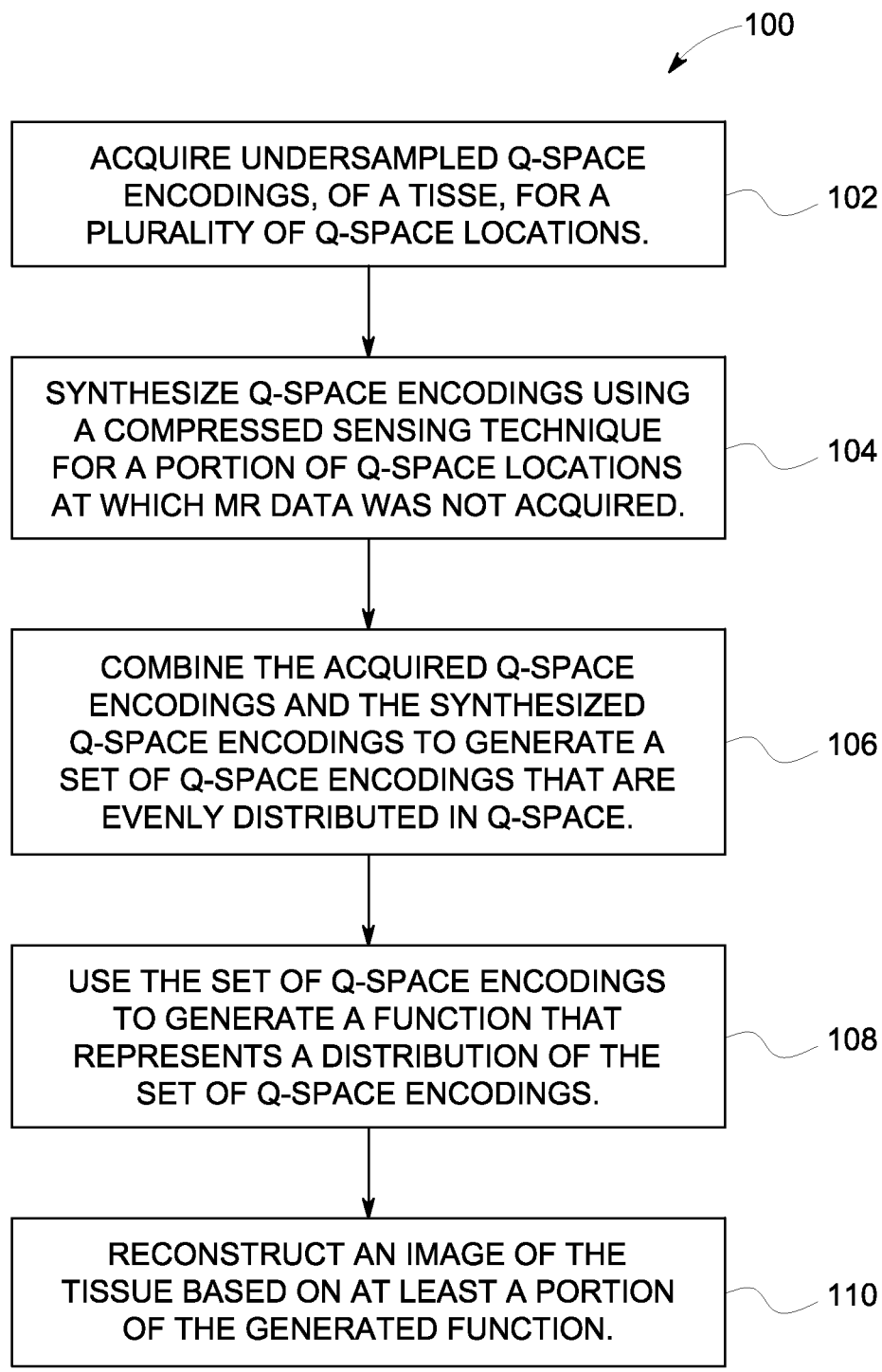
FIG. 2 is an exemplary method for generating a MRI image of an object utilizing the imaging system shown in FIG. 1.

FIG. 2 is a flowchart of an exemplary method 100 for generating a MRI image of an object utilizing the imaging system 10 shown in FIG. 1. However, it should be realized that the various methods of generating an MRI image may be applied to any imaging system and the imaging system 10 shown in FIG. 1 is one embodiment of such an exemplary imaging system. The method 100 may be embodied as a set of instructions that are stored on the computer 20 and/or the DSI module 30, for example.

Figure 3:
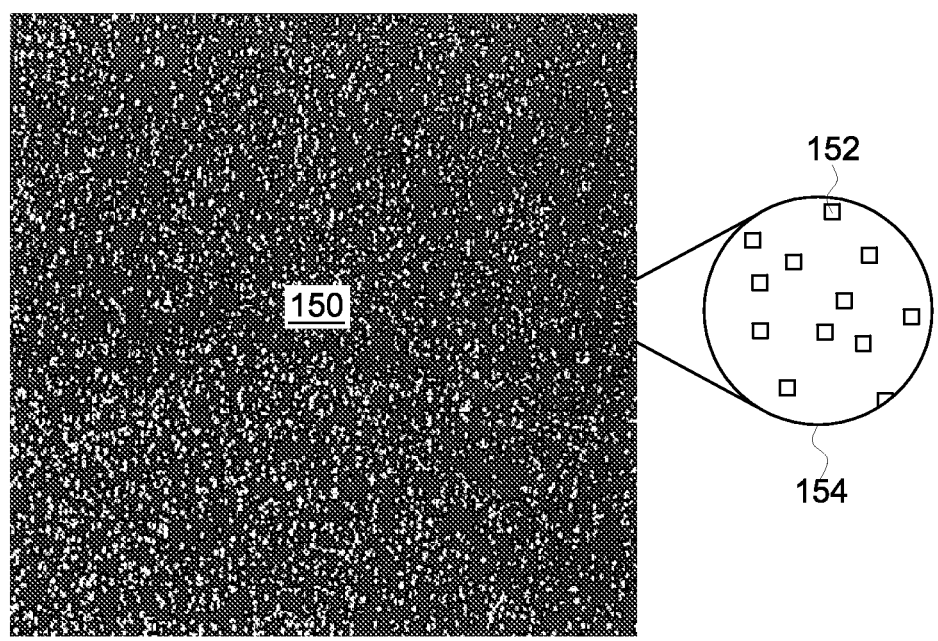
FIG. 3 illustrates an exemplary q-space sampling pattern formed in accordance with various embodiments.

At 102, undersampled q-space encodings for a plurality of q-space locations that is less than an entirety of the q-space locations are generated. For example, FIG. 3 illustrates an exemplary q-space sampling pattern 150. In the exemplary embodiment, the q-space sampling pattern 150 is a 256×256 pixel grid that includes a plurality of randomly generated q-space encodings 152 shown as black areas of FIG. 3. The undersampled q-space encodings may be less than approximately 75% of the q-space encodings in a 256×256 pixel grid. However, it should be realized that more than 75% but less than 100%, or less than 75% of the q-space encodings may be sampled. In another embodiment, the q-space encodings may be uniformly sampled. For example, approximately every $10^{th}$ q-space encoding may be sampled every $20^{th}$ q-space encoding may be sampled, etc. It should be further realized that the quantity of q-space encodings sampled at 102 is based on the size of the pixel grid. As discussed above, the MR signal in q-space is generally related to the water displacement probability density function at a fixed echo time by the Fourier transform. A q-space encoding gradient pulse is generated for each measured location in q-space. Thus, the q-space sampling pattern is described herebelow as a "random sampling pattern" because the q-space encodings are not evenly distributed throughout q-space. More or fewer q-space encodings may be acquired, and the number used herein is solely for exemplary purposes and is not to be considered limiting to the method. As the magnified area 154 illustrates, the acquired q-space encodings 152 are randomly spaced apart throughout q-space. Due to the random distribution of the q-space encodings 152, the sampling pattern 150 generally does not include sufficient information to reconstruct an image of the tissue without imaging artifacts. Thus, an image reconstructed using the q-space sampling pattern 150 may exhibit imaging artifacts. Therefore, while the use of q-space sampling pattern 150 does increase the speed of the data acquisition process by randomly acquiring fewer q-space encodings than a conventional imaging system, the technique generally does not enable a high-quality image reconstruction comparable to that of a fully-sampled image.

Therefore, and referring again to FIG. 2, at 104, a plurality of q-space encodings 156 are synthesized for a portion of q-space locations at which MR data was not acquired, shown as white areas of FIG. 3. In the exemplary embodiment, a plurality of MR signals at q-space encodings 156 that are not acquired at 102 are synthesized by applying a compressed sensing technique to the acquired MR signals at q-space encodings 152. Compressed sensing is an image acquisition and reconstruction technique. In the compressed sensing technique, it is desired that the image have a sparse representation in a known transform domain (such as the wavelet domain) and that the aliasing artifacts due to q-space undersampling be incoherent in that transform domain (i.e., noise-like). In other words, the data sampling pattern is chosen so as to reduce coherency in the sparse domain. This incoherence may be achieved by randomly undersampling the q-space encodings 152, as shown in FIG. 3. The undersampling of the q-space encodings 152 results in aliasing, and when the undersampling is random (as in FIG. 3), the aliasing is incoherent and acts as incoherent interference of the sparse transform coefficients.

Figure 4:
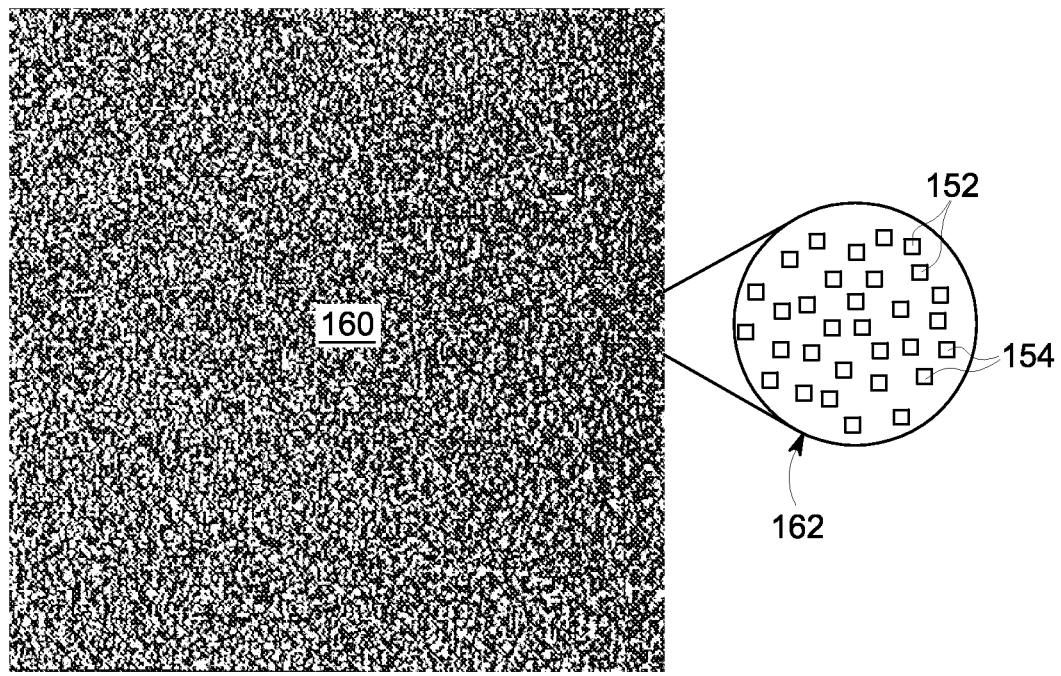
FIG. 4 illustrates another exemplary q-space sampling pattern formed in accordance with various embodiments.

In one embodiment, the MR signals at q-space encodings 156 may be synthesized using a non-linear reconstruction scheme, such as an L1-norm constraint in a cost function minimization method, the sparse transform coefficients can be recovered to synthesize q-space encodings 156 (as shown in FIG. 4), and consequently, the image itself can be reconstructed. In the exemplary embodiment, the sampling pattern 160 includes q-space encodings 152 that are arranged to give incoherent artifacts in the expected-sparse domain when filled in using the q-space encodings 156. It should be realized that the sampling pattern 150 used to acquire the q-space encodings 156 is a pattern that undersamples in a domain in which the image to be reconstructed is expected to be sparse. That is, in most complex medical images, the images exhibit transform sparsity, meaning that the image has a sparse representation in terms of spatial finite differences, wavelet coefficients, or other transforms.

Accordingly, when applying the compressed sensing technique described above, image reconstruction success (e.g., the clarity of the resulting image) is based on the sparsity in the transform domain and that understanding that the incoherent interference be relatively small and have random statistics. Thus, in the compressed sensing technique, the random undersampling of q-space encodings is utilized to generate a sampling pattern 160 that results in incoherent aliasing artifacts. Therefore, the application of the compressed sensing technique to the synthesized q-space sampling pattern 150 shown in FIG. 4 generates high quality information which may be utilized to reconstruct an image having very few artifacts.

Referring again to FIG. 2, at 106 the q-space encodings 152 and the synthesized q-space encodings are combined. For example, FIG. 4 illustrates an exemplary q-space sampling pattern 160 that includes a set 162 of evenly distributed q-space encodings that include both the q-space encodings 152 acquired at 102 and the synthesized q-space encodings 156 acquired using the compressed sensing technique at 104, which are generally randomly distributed throughout q-space.

At 108, the set 162 of q-space encodings are utilized to generate a function that represents a measure of diffusion of the underlying spin population. In one embodiment, the function is a probability distribution function of spin displacement at a given echo time. In another embodiment, the function may be generated through a fitting procedure of the kurtosis expansion to the MR signals measured at the set 162 of q-space encodings. Accordingly, each encoding in the set 162 of q-space encodings may be expressed as a b-value along a given gradient direction n and the MR signals can be expressed in accordance with:

$$\ln[S(b)] = \ln[S_0] - b \sum_{i=1}^{3} \sum_{j=1}^{3} n_i n_j D_{ij} + \frac{1}{6} b^2 D^2 \sum_{i=1}^{3} \sum_{j=1}^{3} \sum_{k=1}^{3} \sum_{l=1}^{3} n_i n_j n_k n_l W_{ijkl}$$ (Eqn. 1)

wherein S(b) denotes the MR signal at the q-space location corresponding to a b-value b and gradient direction n, and $S_0$ is the MR signal in the absence of diffusion encoding gradients. Therefore, Equation 1 has a diffusion tensor term (linear in b), which spans a symmetric 3×3 matrix of the diffusion tensor $D_{ij}$ (6 independent elements, positive definite) and a kurtosis tensor term (quadratic in b), which spans a symmetric 3×3×3×3 matrix (15 independent elements). The diffusion and kurtosis tensors can be determined from Equation 1 by fitting to the amplitude of the MR signal at all measured and synthesized q-space locations.

More generally, let q be the wave vector in q-space, the amplitude of the MR signal is a function of q, S(q), which is related to the spin displacement P(r) probability distribution function by the Fourier transform:

$$S(q) = \int S_0 P(r) e^{iqr} d^3r = S_0 F[P(r)]$$ Eqn. 2 where P(r) is the diffusion propagator for spin displacement r. In Equation 2, Δ (diffusion mixing time)-dependence is omitted for simplicity but it should be noted that the amplitude of the MR signal will depend on echo time, which is directly related to the diffusion mixing time. Accordingly, the diffusion characteristics may be separated into an angular component and a radial component. The angular component of the diffusion propagator (or probability distribution function) reflects the underlying tissue anisotropy, and is typically represented as the orientation distribution function (ODF). Moreover, in one embodiment, the NMR signals may be converted into a set of positive numbers, to exclude phase information. An image may then be reconstructed using the set of positive numbers. The ODF is computed as the integration over a set of weighted radial reconstructions of the (magnitude of the) diffusion propagator P(r) in accordance with:

$$ODF(u) = \int P(\rho u) \rho^2 d\rho$$ (Eqn. 3)

where the ODF is a function of the unit vector u (the weighting factor being the radial component of the Jacobian in spherical coordinates). In operation, the ODF inherently retains only the angular component of the diffusion propagator in each image voxel, while averaging the weighted radial dependence. In essence it represents the probability of the population of spins diffusing in an element of solid angle in the diffusion mixing time. An approximation of this angular function can be measured using, for example, q-ball imaging, which represent subsets of DSI with acquisition of q-space on one spherical single shell or multiple concentric spherical shells instead of a Cartesian grid. Moreover, the radial component of the diffusion propagator encodes information about the physical nature of the diffusion process, which can be analyzed according to a variety of models, such as for example, Gaussian, bi-exponential, higher order tensors, kurtosis, and/or using statistical approaches.

Referring again to FIG. 2, at 110, the function generated at 108 is utilized to reconstruct at least one image of the object, e.g. the structure of the tissue. In the exemplary embodiment, the function represented as Equation 2 may be utilized to generate a second set of functions. The second set of functions may represent a measure of radial diffusion through the tissue, such as a kurtosis scalar. The second set of functions may also represent angular diffusion through the tissue, such as the ODF. A collection of images that represent the diffusion properties of the tissue may then be generated using the second set of functions that highlights different aspects of the function. For example, one image may represent angular diffusion characteristics through the tissue and another image may represent radial diffusion characteristics through the tissue.

Figure 5:
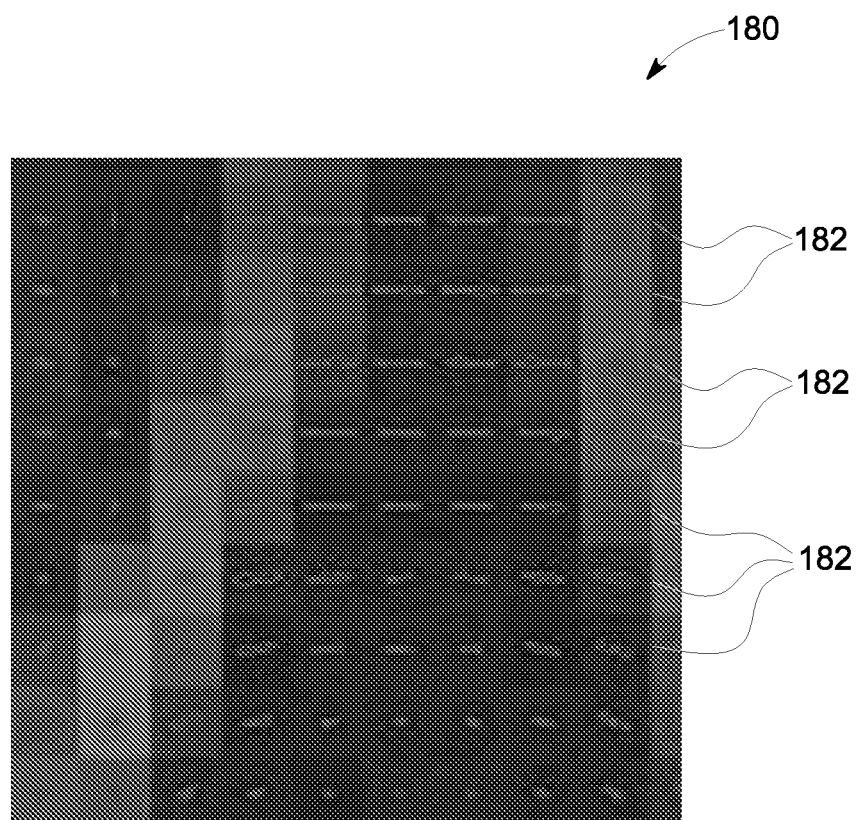
FIG. 5 is an exemplary image that may be reconstructed in accordance with various embodiments.

For example, FIG. 5 illustrates an exemplary image 180 that may be generated using the method described above. Specifically, FIG. 5 specifically illustrates the displacement probability distribution function of the fibers in the tissue of the brain. The lines 182 represent orientation distribution functions. For example, the displacement probability distribution function may be integrated in the radial direction to generate an angular distribution. Thus, the lines 182 indicate the probability that the spin diffuses in this particular direction. Therefore, because the lines 182 are not spheres indicates that there is a preferential direction the spins want to diffuse.

Figure 6:
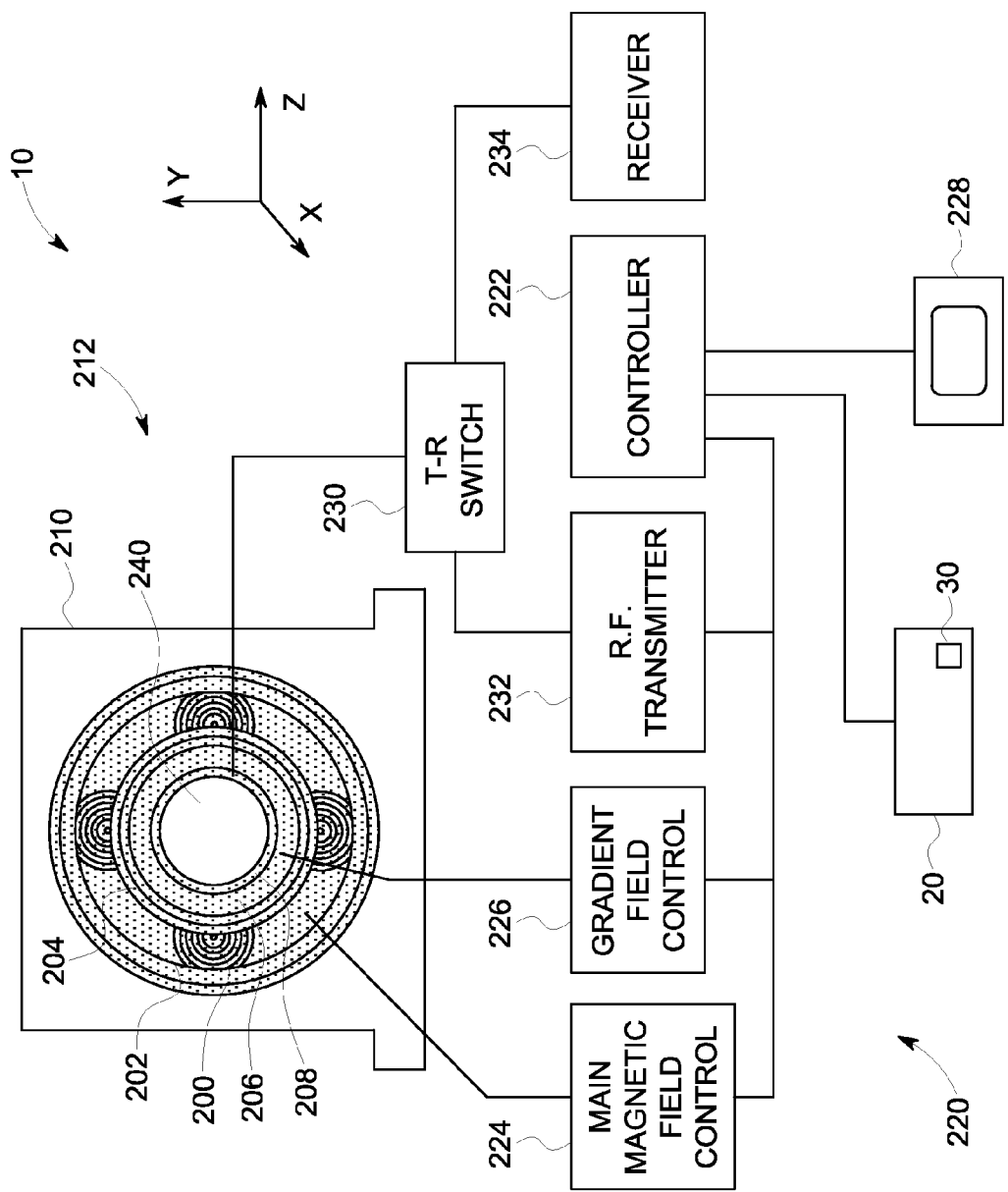
FIG. 6 is a schematic block diagram of an MRI system formed in accordance with various embodiments.

FIG. 6 is a schematic illustration of the imaging system 10 shown in FIG. 1. In the exemplary embodiment, the imaging system 10 also includes a superconducting magnet 200 formed from magnetic coils supported on a magnet coil support structure. However, in other embodiments, different types of magnets may be used, such as permanent magnets or electromagnets. A vessel 202 (also referred to as a cryostat) surrounds the superconducting magnet 200 and is filled with liquid helium to cool the coils of the superconducting magnet 200. A thermal insulation 204 is provided surrounding the outer surface of the vessel 202 and the inner surface of the superconducting magnet 200. A plurality of magnetic gradient coils 206 are provided within the superconducting magnet 200 and an RF transmit coil 208 is provided within the plurality of magnetic gradient coils 206. In some embodiments the RF transmit coil 208 may be replaced with a transmit and receive coil as described in more detail herein. The components described above are located within a gantry 210 and generally form an imaging portion 212. It should be noted that although the superconducting magnet 200 is a cylindrical shaped, other shapes of magnets can be used.

A processing portion 220 generally includes a controller 222, a main magnetic field control 224, a gradient field control 226, the computer 20, a display device 228, a transmit-receive (T-R) switch 230, an RF transmitter 232 and a receiver 234. In the exemplary embodiment, the Diffusion Spectrum Imaging (DSI) module 30 that is programmed to acquire MR signals at undersampled q-space locations, synthesize q-space encodings using a compressed sensing technique, and generate an image of an object using the acquired q-space encodings and the synthesized q-space encodings is installed in the computer 20.

In operation, a body of an object, such as a patient (not shown), is placed in a bore 240 on a suitable support, for example, a motorized table (not shown) or other patient table. The superconducting magnet 200 produces a uniform and static main magnetic field $B_o$ across the bore 240. The strength of the electromagnetic field in the bore 240 and correspondingly in the patient, is controlled by the controller 222 via the main magnetic field control 224, which also controls a supply of energizing current to the superconducting magnet 200.

The magnetic gradient coils 206, which include one or more gradient coil elements, are provided so that a magnetic gradient can be imposed on the magnetic field $B_o$ in the bore 240 within the superconducting magnet 200 in any one or more of three orthogonal directions x, y, and z. The magnetic gradient coils 206 are energized by the gradient field control 226 and are also controlled by the controller 222.

The RF transmit coil 208, which may include a plurality of coils (e.g., resonant surface coils), is arranged to transmit magnetic pulses and/or optionally simultaneously detect MR signals from the patient if receive coil elements are also provided, such as a surface coil (not shown) configured as an RF receive coil. The RF transmit coil 206 and the receive surface coil are selectably interconnected to one of the RF transmitter 232 or the receiver 234, respectively, by the T-R switch 230. The RF transmitter 232 and T-R switch 230 are controlled by the controller 222 such that RF field pulses or signals are generated by the RF transmitter 232 and selectively applied to the patient for excitation of magnetic resonance in the patient.

Following application of the RF pulses, the T-R switch 230 is again actuated to decouple the RF transmit coil 208 from the RF transmitter 232. The detected MR signals are in turn communicated to the controller 222. The controller 222 may include a processor (e.g., the Diffusion Spectrum Imaging (DSI) module 30. The processed signals representative of the image are also transmitted to the display device 220 to provide a visual display of the image. Specifically, the MR signals fill or form a q-space that is reconstructed using the various methods described herein to obtain a viewable image. The processed signals representative of the image are then transmitted to the display device 220.

A technical effect of some of the various embodiments described herein is to improve image quality, while concurrently reducing the time required to perform an MRI scan. More specifically, various embodiments described herein provide a method to accelerate DSI in living systems using compressed sensing (CS). The various methods may be utilized to perform in-vivo imaging of brains or various other tissues. In operation, q-space encodings are undersampled with different sampling patterns and reconstructed using a compressed sensing technique. The methods described herein provide diffusion information such as orientation distribution functions (ODF), and diffusion coefficients. Moreover, compressed sensing can be used to improve the resolution of the displacement probability distribution function while maintaining the same scan time as the unaccelerated acquisition.

Various embodiments described herein provide a tangible and non-transitory machine-readable medium or media having instructions recorded thereon for a processor or computer to operate an imaging apparatus to perform an embodiment of a method described herein. The medium or media may be any type of CD-ROM, DVD, floppy disk, hard disk, optical disk, flash RAM drive, or other type of computer-readable medium or a combination thereof.

The various embodiments and/or components, for example, the monitor or display, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A method of generating a magnetic resonance (MR) image of a tissue, said method comprising:
    acquiring MR signals at undersampled q-space locations for a plurality of q-space locations that is less than an entirety of the q-space locations, wherein the acquired signal at the q-space locations represents the three-dimensional displacement distribution of the spins in the imaging voxel;
    synthesizing q-space encodings using a compressed sensing technique for a portion of q-space locations at which MR signals were not acquired;
    combining the acquired q-space encodings and the synthesized q-space encodings to generate a set of q-space encodings that are evenly distributed in q-space;
    using the set of q-space encodings to generate a function that represents a distribution of the set of q-space encodings; and
    generating an image of the tissue based on at least a portion of the generated function;
further comprising, inducing a population of polarized spins in the tissue to produce a set of nuclear magnetic resonance (NMR) signals, wherein the signals comprise a set of non-uniformly distributed encodings to measure the three-dimensional displacement probability distribution function of the spins in the tissue.

2. The method of claim 1, further comprising, inducing a population of polarized spins in the tissue to produce a set of nuclear magnetic resonance (NMR) signals, wherein the signals comprise a set of complex Fourier-encodings representative of a three-dimensional displacement distribution of the spins in the tissue.

3. The method of claim 2, further comprising, converting each of the NMR signals in the set of complex Fourier-encodings into a positive number to form a set of positive numbers to exclude phase information.

4. The method of claim 1, wherein the function is a probability distribution function, said method further comprising using the set of q-space encodings to generate a probability distribution function at each image voxel that represents a displacement distribution of the spin population.

5. The method of claim 1, further comprising reconstructing at least two images, wherein each image is based on a different portion of the generated function.

6. The method of claim 1, further comprising using the set of q-space encodings to generate a set of functions that represent a radial component of diffusion through the tissue and an angular component of diffusion through the tissue.

7. The method of claim 1, further comprising reconstructing at least two images, wherein a first image represents a radial component of diffusion through the tissue and a second image represents an angular component of diffusion through the tissue.

8. A Magnetic Resonance Imaging (MRI) system comprising a Diffusion Spectrum Imaging (DSI) module having a non-transitory computer readable medium encoding with a program to instruct a computer that is programmed to:
    acquire MR signals at undersampled q-space locations for a plurality of q-space locations that is less than an entirety of the q-space locations, wherein the acquired signal at the q-space locations represents the three-dimensional displacement distribution of the spins in the imaging voxel;
    synthesize q-space encodings using a compressed sensing technique for a portion of q-space locations at which MR data was not acquired;
    combine the acquired q-space encodings and the synthesized q-space encodings to generate a set of q-space encodings that are evenly distributed in q-space;
    use the set of q-space encodings to generate a function that represents a distribution of the set of q-space encodings; and
    generate an image of the tissue based on at least a portion of the generated function;
wherein the Diffusion Spectrum Imaging (DSI) module is further programmed to polarize a population of spins in the tissue to produce a set of nuclear magnetic resonance (NMR) signals, wherein the signals comprise a set of non-uniformly distributed encodings to measure the three-dimensional displacement probability distribution function of the spins in the tissue.

9. The Magnetic Resonance Imaging (MRI) system in accordance with claim 8, wherein the Diffusion Spectrum Imaging (DSI) module is further programmed to induce a population of spins in the tissue to produce a set of nuclear magnetic resonance (NMR) signals, wherein the signals comprise a set of complex Fourier-encodings representative of a three-dimensional displacement of the spins in the tissue.

10. The Magnetic Resonance Imaging (MRI) system in accordance with claim 8, wherein the Diffusion Spectrum Imaging (DSI) module is further programmed to convert each of the NMR signals in the set of complex Fourier-encodings into a positive number to form a set of positive numbers to exclude phase information.

11. The Magnetic Resonance Imaging (MRI) system in accordance with claim 8, wherein the Diffusion Spectrum Imaging (DSI) module is further programmed to use the set of q-space encodings to generate a probability distribution function at each image voxel that represents a displacement distribution of the spin population.

12. The Magnetic Resonance Imaging (MRI) system in accordance with claim 8, wherein the Diffusion Spectrum Imaging (DSI) module is further programmed to reconstruct at least two images, wherein each image is based on a different portion of the generated function.

13. The Magnetic Resonance Imaging (MRI) system in accordance with claim 8, wherein the Diffusion Spectrum Imaging (DSI) module is further programmed to use the set of q-space encodings to generate a set of functions that represent a radial component of diffusion through the tissue and an angular component of diffusion through the tissue.

14. The Magnetic Resonance Imaging (MRI) system in accordance with claim 8, wherein the Diffusion Spectrum Imaging (DSI) module is further programmed to reconstruct at least two images, wherein a first image represents a radial component of diffusion through the tissue and a second image represents an angular component of diffusion through the tissue.

15. A non-transitory computer readable medium encoded with a program to instruct a computer to:
    acquire MR signals at undersampled q-space locations for a plurality of q-space locations that is less than an entirety of the q-space locations, wherein the acquired signal at the q-space locations represents the three-dimensional displacement distribution of the spins in the imaging voxel;

synthesize q-space encodings using a compressed sensing technique for a portion of q-space locations at which MR data was not acquired;

combine the acquired q-space encodings and the synthesized q-space encodings to generate a set of q-space encodings that are evenly distributed in q-space;

use the set of q-space encodings to generate a function that represents a distribution of the set of q-space encodings; and generate an image of the tissue based on at least a portion of the generated function;

wherein said computer readable medium is further programmed to instruct a computer to use the set of q-space encodings to generate a probability distribution function at each image voxel that represents a displacement distribution of the spin population.

16. The computer readable medium in accordance with claim 15, said computer readable medium is further programmed to instruct a computer to reconstruct at least two images, wherein each image is based on a different portion of the generated function.

17. The computer readable medium in accordance with claim 15, said computer readable medium is further programmed to instruct a computer to use the set of q-space encodings to generate a set of functions that represent a radial component of diffusion through the tissue and an angular component of diffusion through the tissue.

* * * * *